United States Patent [19]

Panicker

[11] Patent Number: 4,602,189

[45] Date of Patent: Jul. 22, 1986

[54] LIGHT SINK LAYER FOR A THIN-FILM EL DISPLAY PANEL

[75] Inventor: Ramachandra M. P. Panicker, Camarillo, Calif.

[73] Assignee: Sigmatron Nova, Inc., Thousand Oaks, Calif.

[21] Appl. No.: 541,702

[22] Filed: Oct. 13, 1983

[51] Int. Cl.[4] ...................... H05B 33/22; C04B 35/00; H01L 29/12

[52] U.S. Cl. .................................... 313/505; 313/509; 313/506; 252/62.3 V; 252/62.3 ZT

[58] Field of Search ........................ 313/505, 506, 509; 252/62.3 Z T, 62.3 V

[56] References Cited

U.S. PATENT DOCUMENTS

| | | | |
|---|---|---|---|
| 3,033,791 | 5/1962 | Nobel et al. | 252/62.3 ZT |
| 4,141,777 | 2/1979 | Matveev et al. | 252/62.3 ZT X |
| 4,287,449 | 9/1981 | Takeda et al. | 313/509 |
| 4,455,506 | 6/1984 | Ayyagari et al. | 313/509 X |

FOREIGN PATENT DOCUMENTS 2039146 7/1980 United Kingdom .

OTHER PUBLICATIONS

"Phase Equilibria and Semiconducting Properties of Cadmium Telluride," paper by Dirk De Nobel, pp. 28–99, dated May 1958.

*Primary Examiner*—Palmer C. DeMeo

*Attorney, Agent, or Firm*—John T. Matlago

[57] ABSTRACT

A thin-film electroluminescent (EL) panel operating as a matrix-addressed display is provided with a light sink layer immediately behind the phosphor layer thereof to enhance the legibility of the display under high ambient light conditions. The light sink layer is formed of a p-type semiconductor compound material comprised of 20% lead telluride and 80% cadmium telluride doped with indium. The addition of the indium into the material introduces free electrons which compensate for the hole carriers therein and thereby increases the specific resistivity of the material. The addition of lead into the semiconductor compound material forms the lead telluride which in combination with the cadmium telluride reduces the energy band gap of the material to effectively absorb the ambient light in the visible range which is the source of the bad legibility. Moreover, the lead serves to reduce the mobility of the free charge carriers in the material and thereby further increases the specific resistivity of the material. Thus, the combined effects of the indium and the lead provide the semiconductor compound material with a specific resistivity in the range of $10^8$ to $10^{12}$ ohm-centimeter. Such a high specific resistivity material for the light sink layer is especially useful in enabling the EL panel to operate with a relatively steep luminance vs. voltage characteristic curve as required for multiplexing operation of the matrix-addressed EL panel.

8 Claims, 11 Drawing Figures

FIG. 4
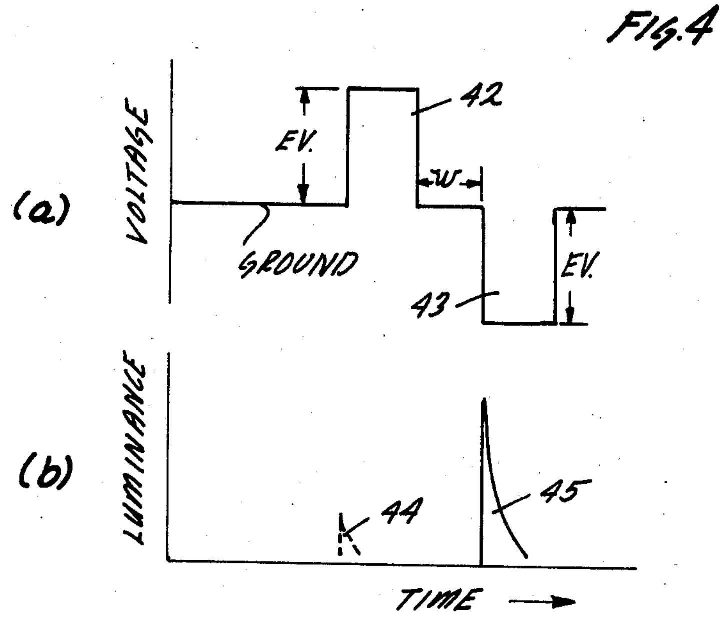
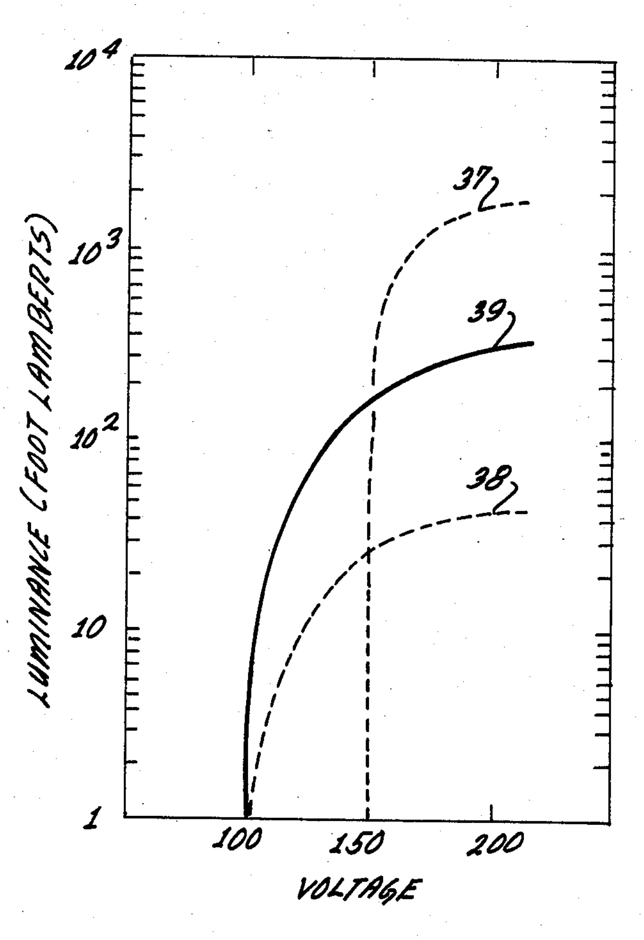
FIG. 5

CdTe
CARRIER CONCENTRATION HOLES/ELECTRONS per c.c.
10^17
10^16
10^15
10^14
10^1
10^0
p
n
40
41
S
LOG a_Cd CdTe:In CARRIER CONCENTRATION HOLES/ELECTRONS per c.c.
10^17
10^16
10^15
10^14
10^1
10^0
n
S
LOG a_Cd FIG. 7
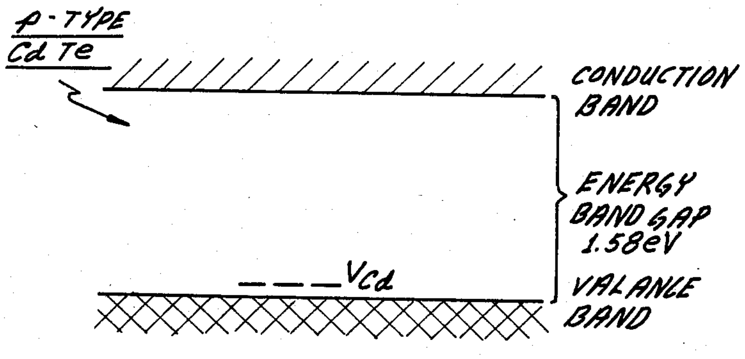
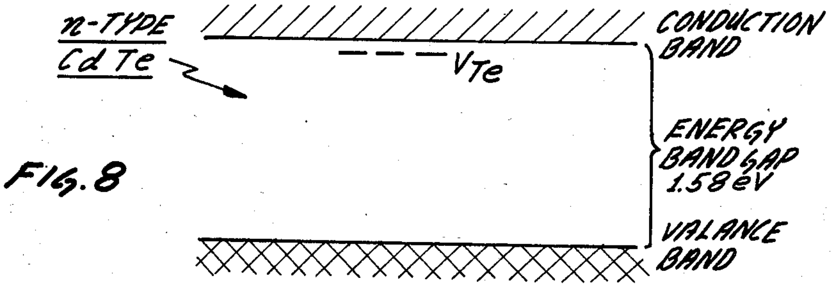
FIG. 8
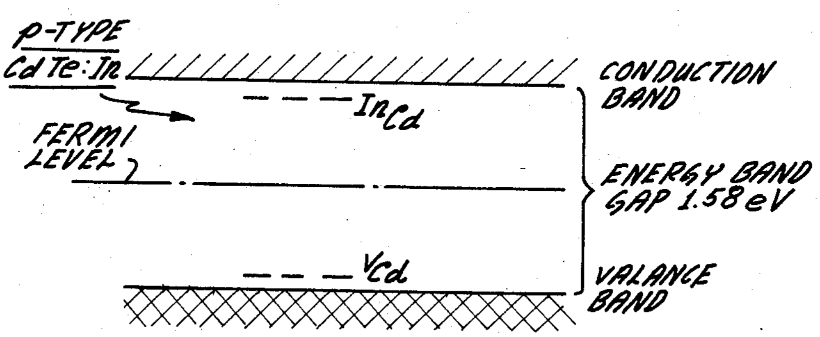
FIG. 9
FIG. 11
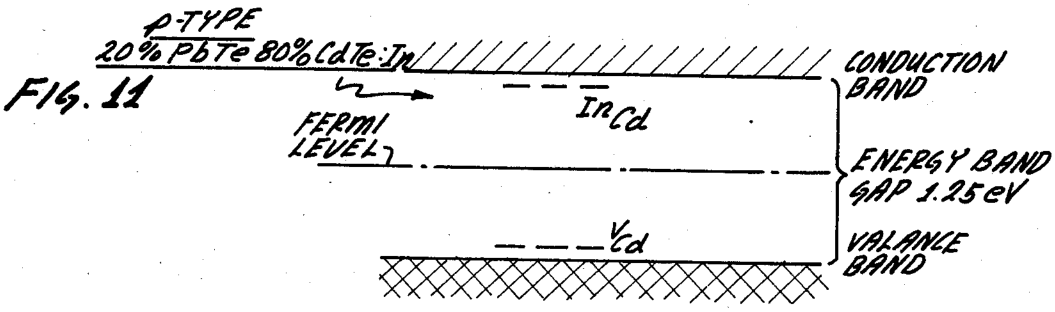

LIGHT SINK LAYER FOR A THIN-FILM EL DISPLAY PANEL

BACKGROUND OF THE INVENTION

This invention relates to electroluminescent (EL) display panels and more particularly to a light sink layer for use in enhancing the legibility of such a panel under high ambient light conditions.

A typical matrix-addressed EL panel includes a phosphor layer sandwiched between a pair of dielectric layers with a set of transparent indium tin oxide (ITO) electrodes provided over the front dielectric layer thereof and a set of counter aluminum electrodes provided over the rear dielectric layer thereof. When such an operating matrix-addressed EL panel is viewed under high ambient light conditions, a substantial amount of the ambient light entering the front of the EL panel is reflected off the rear aluminum electrodes back to the viewer making it difficult to distinguish between the selectively illuminated pixels and the non-illuminated pixels on the EL panel. Thus, to enhance the contrast between the illuminated and non-illuminated pixels on the EL panel, it has previoulsy been proposed to provide a light absorbing layer immediately behind the phosphor layer for absorbing the incoming ambient light.

The problem with such a light absorbing layer on an EL panel is that heretofore the only materials available for this purpose have been those that have a relatively low electrical specific resistivity. However, because of the multiplexing operation of the matrix-addressed EL panel, wherein the aluminum electrodes are sequentially electrically driven and selected ones of the ITO electrodes are simultaneously electrically driven in accordance with video data such that selected ones of the pixels along the driven aluminum electrode are energized at the same time, it is necessary for the light absorbing layer to be made of a material having a sufficiently high resistivity so that the EL panel can operate with a relatively steep luminance vs. voltage characteristic curve. It is thus seen that it is very important to provide a material for use as a light absorbing layer for a matrix-addressed EL panel which not only can effectively absorb light in the visible range but which also has a relatively high electrical specific resistivity.

SUMMARY OF THE INVENTION

In accordance with the present invention, a material for a light absorbing layer, hereinafter referred to as a light sink layer, to be deposited immediately behind the phosphor layer of a thin-film EL panel is formed of a p-type semiconductor compound material comprised of 20% lead telluride and 80% cadmium telluride doped with indium. The indium provides for introducing free electrons into the material which compensate for the hole carriers therein and thereby increases the specific resistivity of the material. The lead telluride in combination with the cadmium telluride serves to tailor the energy band gap of the semiconductor compound material to absorb light in the visible spectrum, and the presence of the lead, per se, in the material effectively serves to reduce the mobility of the free charge carriers therein and therefore further increases the specific resistivity of the material. The indium and lead thus result in the resistivity of the material being on the order of $10^8$ to $10^{12}$ ohm-centimeter which is a resistivity more closely associated with the lower range of a dielectric material. Such a high resistivity of the light sink layer material enables the EL panel to operate with a relatively steep luminance vs. voltage characteristic curve as needed for a matrix-addressed EL panel.

Accordingly, one of the objects of the present invention is to provide a material especially adapted for use as a light sink layer immediately behind the phosphor layer in an EL panel.

Another object of the present invention is to provide a light sink layer material for an EL panel which has a resistivity high enough to permit multiplexing operation of the EL panel.

Another object of the present invention is to provide a p-type semiconductor compound material comprised of lead telluride and cadmium telluride doped with indium for use as a light sink layer in an EL panel being used as a matrix-addressed display.

Still another object of the present invention is to provide for adding lead to a p-type cadmium telluride semiconductor compound doped with indium wherein the lead forms lead telluride which serves to reduce the energy band gap of the compound so that it effectively absorbs light in the visible range and wherein both the lead and the indium serve to increase the level of resistivity of the semiconductor compound so that it is useful as a light sink layer in a matrix-addressed EL display panel.

Yet another object of the present invention is to provide a high resistivity light sink layer material for an EL display panel comprised of a p-type semiconductor compound including cadmium telluride and lead telluride doped with indium wherein the amount of cadmium in the compound can vary and still maintain the high resistivity thereby making the material easy to fabricate.

Other objects and attendant advantages will be appreciated by those skilled in the art as the invention becomes better understood by reference to the following description when considered in connection with the accompanying drawings.

BRIEF DESCRIPTION OF THE DRAWINGS

FIG. 4 shows graphs illustrating the drive voltage as applied to refresh a pixel on the EL panel in FIG. 3 and the luminance output thereof;

FIG. 5 is a graph showing the affect the conductivity of the light sink layer in an EL panel has on the luminance vs. voltage operation thereof;

FIG. 7 is the energy band gap diagram of a cadmium telluride semiconductor compound in the form of p-type material;

FIG. 8 is the energy band gap diagram of a cadmium telluride semiconductor compound in the form of n-type material;

FIG. 9 is the energy band gap diagram of the p-type cadmium telluride semiconductor compound compensated with indium;

FIG. 11 is the energy band gap diagram of the p-type 20% lead telluride and 80% cadmium telluride semiconductor compound doped with indium.

DETAILED DESCRIPTION OF THE PREFERRED EMBODIMENT

Figure 1:
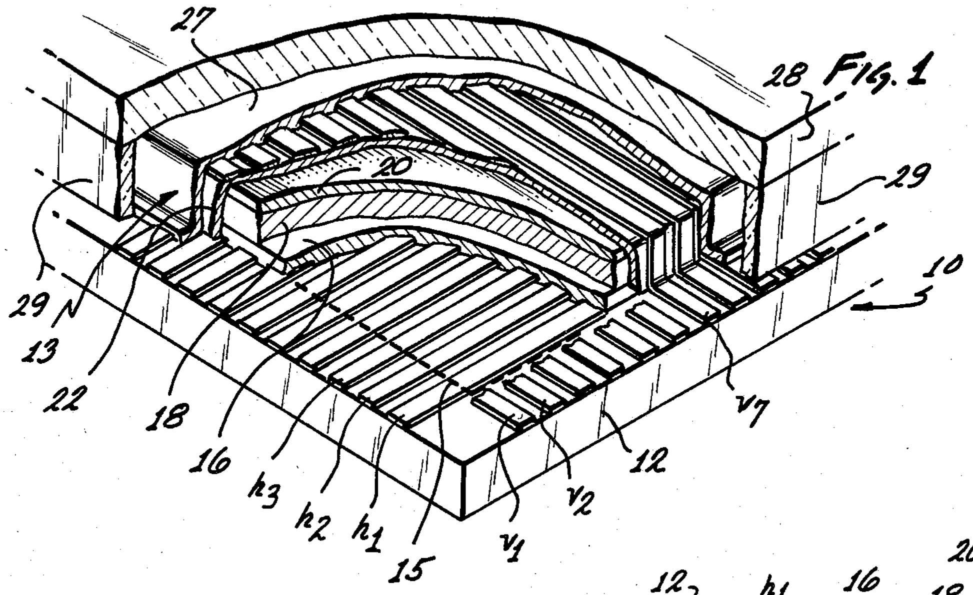
FIG. 1 is a perspective pictorial view showing a portion of a thin-film matrix-addressed EL panel having a light sink layer in accordance with the present invention positioned intermediate the phosphor layer and the back dielectric layer thereof.

Referring to FIG. 1 of the drawings, an electroluminescent display panel 10 is shown to comprise a glass substrate 12 having deposited thereon a thin-film sandwich structure 13 which includes a plurality of thin films or layers. The thin-film sandwich structure 13 is formed by first depositing a transparent layer of indium tin oxide to a thickness of about 1700 Angstrom units over the surface of the glass substrate 12, and then photoetching the indium tin oxide to form a plurality of parallel separated transparent electrodes $h_1$, $h_2$–$h_n$. A dielectric, such as a transparent yttria layer 16, is then sputtered to a thickness of about 2000 Angstrom units over the active area 15 of the panel 10. Next, a transparent phosphor layer 18, such as zinc sulfide doped with manganese, is evaporated to a thickness of about 6000 Angstrom units over the yttria layer 16. A light sink layer 20 which is a light absorbing material fabricated in accordance with the present invention is then deposited to a thickness of about 2500 Angstrom units immediately over the phosphor layer 18. The light sink layer 20 is followed by a second yttria layer 22 which is deposited by sputtering to a thickness of about 2000 Angstrom units. A plurality of parallel separated aluminum electrodes $v_1$, $v_2$–$v_n$ is then evaporated through a suitable mask to a thickness of about 1200 Angstrom units over the second yttria layer 22 so as to extend in a direction at right angles to the transparent front electrodes $h_1$, $h_2$–$h_n$. Finally, a layer 27 of alumina is deposited to a thickness of approximately 1500 Angstrom units over the back surface of the sandwich structure so far formed to encapsulate the electrodes $v_1$, $v_2$,–$v_n$. A back glass protective cover 28 is then held on the glass substrate 12 slightly spaced from the back of the thin-film structure 13 by a marginal seal 29 of resin.

Figure 2:
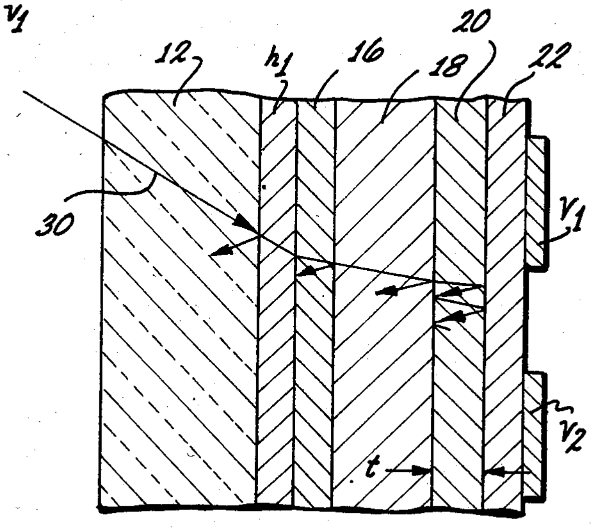
FIG. 2 is an optical diagram illustrating how incident ambient light entering the front of the EL panel is absorbed in the light sink layer thereof.

Reference will next be made to FIG. 2 which is a schematic cross-sectional view of the EL panel 10 showing the path of an incident ambient ligt ray 30 through the various thin-film layers thereof. Thus, the light ray 30, upon entering the glass substrate 12 on the front of the EL panel 10, passes through the successive transparent layers into the light sink layer 20. Typically the indium tin oxide (ITO) electrodes $h_1$, $H_2$,–$h_n$ have an index of refraction of about 2.1, the first yttria layer 16 has an index of refraction of about 2.0, the ZnS:Mn phosphor layer 18 has an index of refraction of about 2.35, the light sink layer 20 has an index of refraction of about 4.0, and the back yttria layer 22 has an index of refraction of about 2.0.

It should be noted that the ITO, yttria, and phosphor layers in front of the light sink layer 20, are each made of materials having refractive indexes that are as close as possible to each other, and the thickness of each of these layers is optimized so as to minimize the reflections at their interfaces.

The light sink layer 20 is made of a material with a very high absorption coefficient and an optimum thickness t so that reflection at its interface with the phosphor layer is minimized for a broad range of wavelengths of the visible light.

It should be especially noted that the high index of refraction equal to 4.0 for the light sink layer 20 serves to trap the ambient light rays, not yet absorbed, by multiple internal reflections, thus ensuring that these light rays will eventually be absorbed in the light sink layer.

As a result of such a construction of the thin-film sandwich structure 13 for the EL panel 10, it has been experimentally determined that the reflection of the ambient light at the internal interfaces thereof and the absorption of the ambient light in the light sink layer 20 thereof is controlled such that the diffuse relectivity as viewed from the front of the EL panel is less than 1%.

Figure 3:
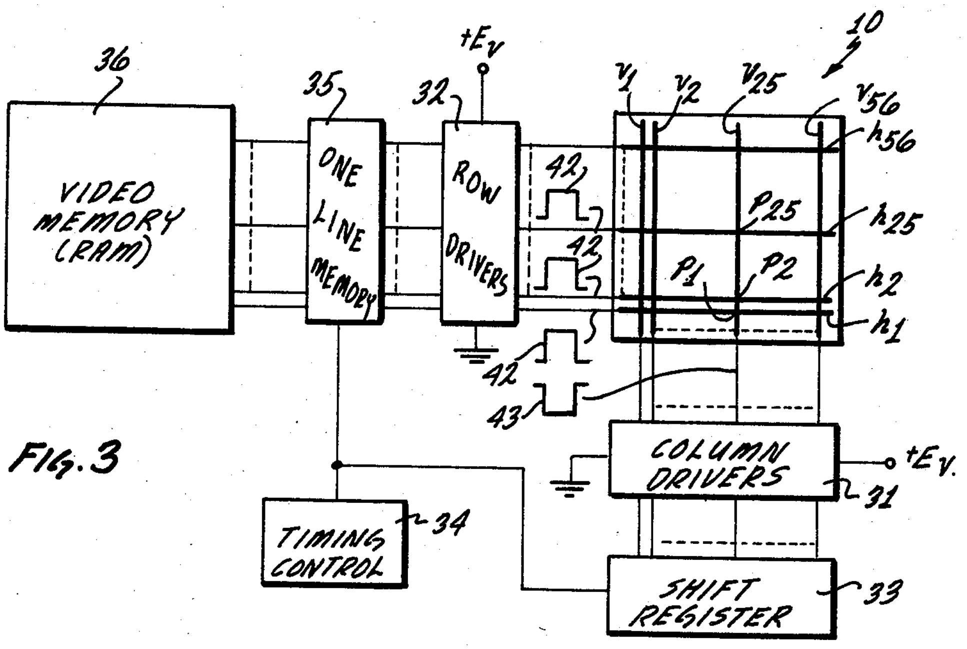
FIG. 3 is a block diagram schematically illustrating the multiplex drive operation of the EL panel having incorporated therein the light sink layer of the present invention.

Reference will next be made to FIG. 3 which shows a block diagram of a typical matrix-addressed system for use with the EL panel 10 shown in FIG. 1. It is assumed that the EL panel 10 has 56 column electrodes $v_1$, $v_2$,–$v_{56}$ and 56 row electrodes $h_1$, $h_2$,–$h_{56}$.

Thus, as shown in FIG. 3, the EL panel 10 is provided with column drivers 31 for applying driving voltages to the column electrodes $v_1$, $v_2$,–$v_{56}$ and with row drivers 32 for applying driving voltages to the row electrodes $h_1$, $h_2$,–$h_{56}$.

A shift register 33 is provided with an output connected to each of the column drivers 31. The shift register 33 advances a pulse therein in response to each timing signal received from a timing control 34 to successively energize its outputs to gate a respective column driver 31 to apply a drive voltage on each of the 56 column electrodes $v_1$, $v_2$,–$v_{56}$, in turn, during each cycle or frame time period that the EL panel is operating to display video information.

A one-line memory 35 having a storage element therein associated with each of the 56 row electrodes $h_1$, $h_2$,–$h_{56}$, provides for controlling the respective row drivers 32. Thus, as a column of data is successively fed out of a video ram 36 into the one-line memory 35, in response to a timing signal received from the timing control 34, each of the storage elements of the one-line memory 35 that is storing a binary 1 digit serves to simultaneously gate a respective row driver 32 to apply a drive voltage on an associated row electrode $h_1$, $h_2$,–$h_{56}$.

Thus, in FIG. 3, when a column driver 31 is actuated to provide a drive voltage on aluminum electrode $v_{25}$, for example, and when the one-line memory 35 has video data therein which simultaneously actuates selected ones of the row drivers 32 to simultaneously provide drive voltages on the ITO electrodes $h_1$, $h_2$, and $h_{25}$, for example, the pixels $p_1$, $p_2$, and $p_{25}$ along the selected aluminum electrode $v_{25}$ are simultaneously illuminated. It should be appreciated, of course, that any number of pixels along the selected aluminum electrode can be illuminated depending on the incoming video data.

FIG. 4 shows the drive voltages as applied across the pixel $p_{25}$, for example, in order to refresh it. The drive voltage is initially in the form of a first square wave pulse 42 which includes a positive voltage E on the $h_{25}$ electrode and a ground on the $v_{25}$ electrode causing the pixel $p_{25}$ to charge in one direction. Following this, both electrodes $v_{25}$ and $h_{25}$ are at ground for a short interval w. Then the drive voltage is in the form of a second square wave pulse 43 which includes a positive voltage E on the $v_{25}$ electrode and a ground on the $h_{25}$ electrode causing the pixel $p_{25}$ to charge in the opposite direction. It should now be clearly understood that each time a pixel on the EL panel is refreshed it receives square wave pulses 42 and 43.

It should be particularly noted, as illustrated in FIG. 4*b*, that when the ITO electrode $h_{25}$ has a positive voltage thereon, which means the aluminum electrode $v_{25}$ is at ground or negative thereto, very little light 44 is emitted by the phosphor layer 18. On the other hand, when the electrode $h_{25}$ is ground and the aluminum electrode $v_{25}$ has a positive voltage thereon, a substantial amount of light 45 is emitted by the phosphor layer.

It is thus seen that when drive voltages are simultaneously applied on selected ones of the row electrodes $h_1$–$h_{56}$, selected ones of the pixels along the length of a selected one of the column electrodes $v_1$–$v_{56}$ will be multiplexed, i.e., simultaneously refreshed. By repeating the operation of reading a column of data from the video ram 36 into the one-line memory 35, as the corresponding one of the column electrodes $v_1$–$v_{56}$ is selected to be driven, all the pixels on the EL panel are refreshed a column at a time, during each frame time period, and the operation repeats itself on successive frame time periods to maintain the picture on the EL panel. It should be appreciated, of course, that the refreshing rate of the data to be displayed on the EL panel must be faster than a certain minimum rate in order to give the eye the impression that it is viewing a continuous picture.

Now, inasmuch as the light sink layer 20 is incorporated within the front and back dielectric layers 16 and 22 of the EL panel 10, it is highly important that it be made of a material having a sufficiently high resistivity to enable the EL panel to operate with a relatively steep luminance vs. voltage characteristic curve so that the pixels will have a fast response to the step voltages provided by the square wave driving pulses 42 and 43 to provide maximum luminance at the high refresh rate that the EL panel is operating.

Referring next to the graph in FIG. 5, curve 37 is a typical luminance vs. voltage characteristic curve of an EL panel without a light sink layer behind the phosphor layer 18 thereof. Thus, in this case, the phosphor layer has on either side thereof a dielectric layer with a very high resistivity, typically in the range of $10^{12}$ to $10^{16}$ ohm-centimeter. Consequently, the EL panel has a luminance vs. voltage characteristic curve with an ideal steep slope, i.e., a substantially vertical slope, as shown. Such a slope provides maximum luminance of the EL panel at as low a voltage as possible.

Now when a light sink layer 20 which has a resistivity much lower than a dielectric, in the range of $10^4$ to $10^5$ ohm-centimeter, for example, is inserted behind the phosphor layer of an EL panel, it provides a luminance vs. voltage characteristic curve such as that shown by curve 38 in FIG. 5. The incorporation of such a light sink layer 20 reduces the threshold voltage of the EL panel by as much as 50 volts, showing thereby that electrons can be injected at a lower threshold voltage from the light sink layer-phosphor layer interface. Thus, the depth of the states at this interface must be shallower compared to the back yttria layer-phosphor layer interface on the EL panel without the light sink layer. However, because of the lower resistivity of such a light sink layer, the slope of its luminance vs. voltage characteristic curve is greatly reduced making it unsuitable for multiplex driving of the EL panel. Moreover, such a low specific resistivity causes considerable power dissipation in the light sink layer and results in a reduction in luminance and heating of the EL panel.

It should now be evident that what is desired for a light sink layer behind the phosphor layer of a matrix-addressed EL panel, because of the very high field and localized regions of high current existing in the phosphor layer thereof, is a material which has a resistivity many orders higher that that represented by curve 38. In particular, what is desired is a light sink layer material that has a resistivity on the order of $10^8$ to $10^{12}$ ohm-centimeter so as to provide a luminance vs. voltage characteristic curve, such as curve 39, which has a slope much steeper than curve 38 and operates at a significantly higher luminance level. It should be especially noted that curve 39, similarly to curve 38, has a threshold voltage which is about 50 volts less than the threshold voltage of the EL panel without a light sink layer.

In view of the above, it should now be clearly understood that when choosing a material for use as the light sink layer 20 on an EL panel 10, it is important not only for this material to be able to absorb the ambient visible light which is the source of the bad contrast upon viewing the EL panel but it is also important for this material to have sufficiently high resistivity so that the EL panel can operate with a relatively steep luminance vs. voltage characteristic curve as needed to provide for a multiplexed drive of the EL panel.

In order to understand how to fabricate the light sink layer material of the present invention, first to be noted is that, in accordance with the band theory of solids which relates to the motion of electrons therein, certain materials are characterized as having an energy band gap. Such a band gap may be visualized as including a valance band spaced from a conduction band wherein the spacing corresponds to a given amount of energy expressed in electron volts (eV). Now it is well understood that light rays in the visible range can also be expressed as energy within the range of 1.60 eV to 3.30 eV. Thus, in accordance with the band theory, if the energy of the light waves impinging on a material is less than the energy of the band gap of the material, the light waves pass right through the material, i.e., the material is transparent to the light waves. On the other hand, if the energy of the light waves impinging on a material is equal to or greater than the energy of the band gap of the material, the light waves are able to excite the electrons in the material from the valance band into the conduction band, thus converting the energy of the light waves into other forms of energy. It is in this manner that the light waves are absorbed in a material. Therefore, in order for a material to be able to completely absorb light waves in the visible range it should have a band gap of less than 1.60 eV which is the lowest wave length in the visible light range.

Now, although dielectric materials have a very high resistivity, on the order of $10^{12}$ to $10^{16}$ ohm-centimeter, they cannot be used for a light sink layer because they have such large band gaps that they never absorb visible light but, rather, are transparent to such light waves.

On the other hand, although highly conductive materials have a good light absorption characteristic, because their band gaps are so narrow that electron-hole pairs can be easily generated, they cannot be used for a light sink layer in a matrix-addressed display panel because of their very low resistivity.

It is for the above reasons, therefore, that the material chosen as a compromise for use as a light sink layer is a semiconductor material. Now, as a class, semiconductor materials are compounds which have relatively small band gaps and are therefore good absorbers of visible light, and they have resistivities which are considerably higher than metals. However, the resistivities of semiconductor materials are still not high enough for matrix-addressed displays. In other words, semiconductor materials do not naturally exist with the high resistivities desired. They typically have a specific resistivity which in the high end of the range is about $10^4$ to $10^5$ ohm-centimeter, instead of in the range of $10^8$ to $10^{12}$ ohm-centimeter, and consequently, in their native state, they are not useful as a light sink layer immediately behind the phosphor layer of a matrix-addressed EL panel.

In order to understand the reason the semiconductor compounds naturally have a relatively low resistivity, reference will next be made to FIG. 6 which shows a graph of the concentration of charge carriers in the semiconductor compound cadimum telluride (CdTe) as a function of the activity of cadmium, $a_{Cd}$, therein. It should be noted that the compound CdTe is chosen because it has a high absorption characteristic and a high index of refraction previously mentioned as being desirable for a light sink layer. Thus, in the graph of FIG. 6, the ordinate is the logarithm of the number of charge carriers, either holes or electrons, formed in the compound CdTe by combining Cd and Te, and the abscissa is the logarithm of the cadmium activity, $a_{Cd}$, in the compound CdTe.

Figure 6:
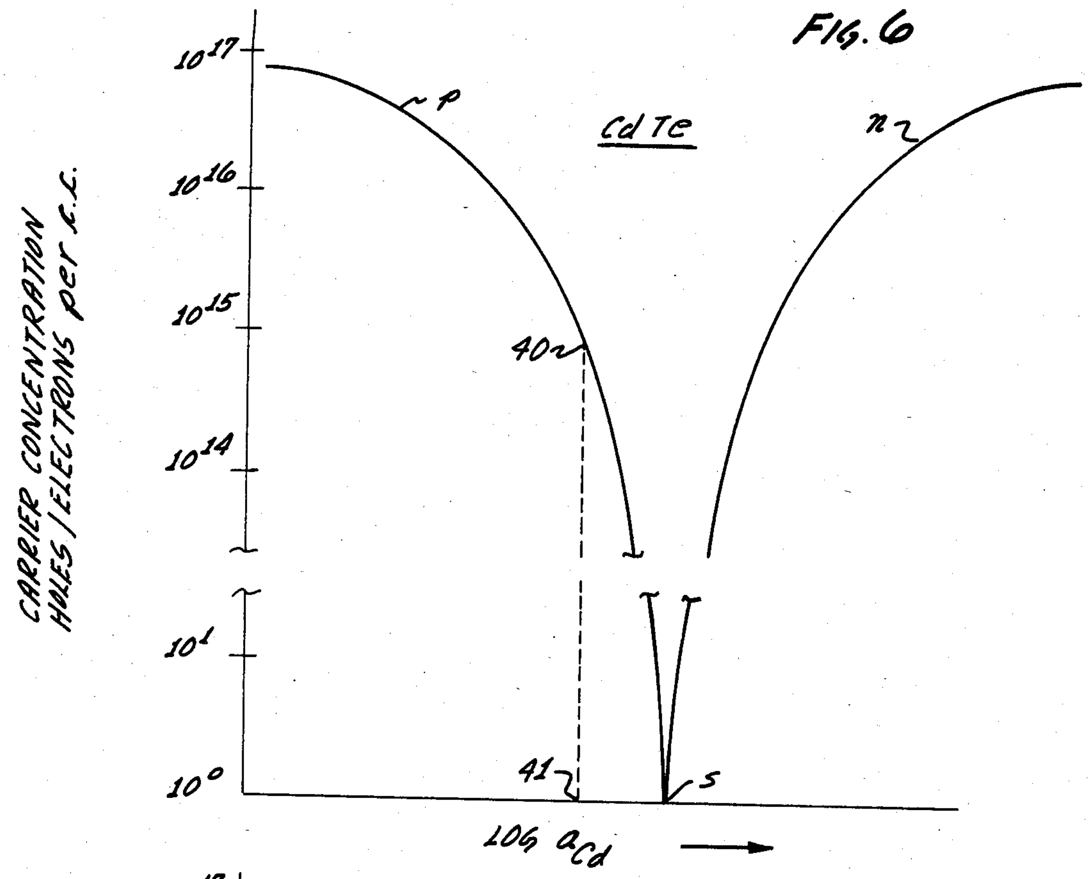
FIG. 6 is a graph showing how the carrier concentration in a cadmium telluride semiconductor compound varies with cadmium activity therein.

Thus, as shown in FIG. 6, as the cadmium activity, $a_{Cd}$, increases in the CdTe compound, which is initially of the p-type, the hole carrier concentration decreases, as indicated by the p-curve, from on the order of $10^{17}$ holes per c.c. down toward zero as it approaches the stoichiometric point S, and, then, as the cadmium activity, $a_{Cd}$, continues to increase past this point S, the electron carrier concentration increases upward from zero to on the order of $10^{17}$ electrons per c.c., or more, as indicated by the n-curve.

Now, it is noted that if the CdTe compound is stoichiometric, i.e., if the compound were to correspond to the ideal point S on the curve in FIG. 6, it would have no free carriers and, consequently, no conductivity. In other words it would be an ideal high specific resistivity material. However, in order to combine Cd with Te stoichiometrically to form the semiconductor compound CdTe, it is necessary to have the exact proportions of 50% cadmium and 50% tellurium, and it is thermodynamically impossible for these elements to be naturally combined in such exact proportion. Actually, in spite of the caution taken to combine them in the exact proportions needed, there will be either a deficiency of Cd or a deficiency of Te in the compound as formed.

Thus, when the semiconductor compound CdTe is deficient in Cd it exhibits charge carriers as holes, i.e., is of the p-type, and when it is deficient in Te it exhibits charge carriers as electrons, i.e., is of the n-type. Moreover, if the semiconductor compound is of the p-type, it cannot have any n-type conduction present, and if the semiconductor compound is of the n-type, it cannot have any p-type conduction present. It is either one or the other.

It should now be clearly understood that if there is a small deficiency of Cd in the compound CdTe, in other words if the amount of Cd is less than stoichiometric, there exist vacancies of cadmium, $V_{Cd}$, and, as shown in FIG. 7, that will introduce an acceptor level in the band gap of the compound which is close to the valance band making the material p-type. So this material becomes conductive by holes and the conductivity is directly proportional to the number of $V_{cd}$. The p-type CdTe is, therefore, not practical for use as a light sink layer in an EL panel because it does not have a high specific resistivity, even at room temperature.

By the same token, if there is a small deficiency of Te in the compound CdTe, in other words if the amount of Te is less than stoichiometric, there exist vacancies of tellurium, $V_{Te}$, and as shown in FIG. 8, that will introduce a donor level in the band gap of the compound which is close to the conduction band making the material n-type. So the material becomes conductive by electrons and the conductivity is directly proportional to the number of $V_{Te}$. This n-type CdTe, likewise, is not practical for use as a light sink layer in an EL panel because it does not have a high specific resistivity, even at room temperature.

In either event, p-type or n-type, it is for this reason that these compounds tend to be of lower resistivity. Namely, the free carriers formed in the semiconductor compound that make the material conductive is due to the fact that the semiconductor compound is not stoichiometric.

It should be particularly noted in FIG. 6, that as the cadmium activity, $a_{Cd}$, in the compound CdTe, increases, as soon as hole conduction ceases the electron conduction takes over. As a result, there is only an extremely narrow range, i.e., the pin point S, where the compound could have this extremely high resistivity. In fact, attempts to form the high resistivity stoichiometric point S material fail because the range is so minute that the material inevitably ends up either on the p-curve or the n-curve with the resulting free carriers that lead to the resistivity being on the order of $10^2$ to $10^5$ ohm-centimeter.

It should now be clearly understood that the semiconductor compound CdTe, as shown in FIG. 6, cannot be used as a light sink layer for a matrix-addressed display panel because due to its relatively low resistivity, it creates crosstalk and power dissipation, and hinders the multiplexing drive operation of the EL panel.

In accordance with the present invention, in order to modify the semiconductor compound CdTe shown in FIG. 6 to make it more resistive, the compound initially is made Te-rich, i.e., at low $a_{Cd}$, so as to be deficient in Cd, that is $V_{Cd}$, so as to have control over it. The compound is thus purposely made rich in Te to obtain a p-type semiconductor material which is non-stoichiometric. By making the compound Te-rich it is evident that a Cd atom is not provided for every Te atom. There are more Te atoms than required and hence the accompanying $V_{Cd}$.

Now the objective is to introduce a level in the band gap of the p-type material shown in FIG. 7 which donates electrons to the conduction band and which will thereby compensate for the holes in the valance band due to the $V_{Cd}$ acceptor level so that the charge carriers are neutralized, i.e., so that the material tends to be rid of any free carriers due to the acceptor level, thereby increasing the resistivity of the compound to a maximum when the number of donors equals the number of acceptors.

To accomplish this, a dopant or donor, i.e., an impurity that increases the number of free electrons, is added to the p-type CdTe semiconductor compound when it is formed. The donor in this case is indium.

Thus, in the semiconductor compound CdTe which is deficient in cadmium, namely, containing $V_{Cd}$, since some of the Te atoms do not have Cd atoms to combine with, the indium atoms will join instead in their place, $In_{Cd}$, and, when they do, each indium atom provides an extra electron. In other words, when an indium atom is introduced in place of the cadmium atom, since an indium atom has three electrons and only two electrons are needed to replace a cadmium atom in combination with a tellurium atom, there is an extra electron which is free to wander around anywhere it wants to. Thus, indium is a donor of electrons.

Reference will next be made to FIG. 9 which shows the position of the levels of the dominant defect, the $V_{Cd}$, near the valance band, and shows the position of the compensating levels of the donor indium, the $In_{Cd}$, near the conduction band. The levels compensate for each other so that the hole carriers in the material are neutralized by the electron carriers. Moreover, in FIG. 9, the position of the Fermi level, which is one way of noting whether a material is p-type or n-type, is shown to be in the middle of the band gap, thus indicating that the material is neither p-type or n-type, but, rather, that the p-type material has been externally compensated for.

Now to determine the exact amount of indium to put into a particular composition of cadmium deficient compound CdTe to compensate for the hole carriers in the p-type material, as previously mentioned, the compound is initially purposely made of 50% Cd and 50% Te by weight and then an additional small amount of Te, on the order of, for example, 0.05 gram per 100 grams of the compound is added to provide a Te-rich compound. It is possble to determine if the material is actually p-type by making a "hot probe" measurement. A thin-film of the material is made and then two spaced probes are placed on its surface and connected to a millivoltmeter to form a circuit. Then one of the probes is heated. As a result, either type of carriers, holes or electrons, start to move towared the cold junction. There will be an emf between the two probes and by checking the polarity of the emf it is possible to determine whether the conduction is by electrons or holes, and, consequently, whether the semiconductor material is n-type or p-type.

Once, having established that the material is of the desired p-type, it does not matter how many hole carriers there are in the material. Moreover, if a measurement were to be made in a well known manner by the use of four probes to determine the resistivity of the material, the reading would typically be, for exammple, $10^4$ to $10^5$ ohm-centimeter.

Several batches of this p-type material are then provided, each equal to 100 grams, for example. Then a small amount of indium. increasing in increments of 0.05 gram, for example, is put in each of the several batches. A resistivity measurement is then performed on each of the batches of material having increasing amounts of indium, by the use of four probes, to determine the composition of the particular batch which gives the maximum resistivity. This resistivity will typically be on the order of $10^6$ to $10^7$ ohm-centimeter.

Figure 10:
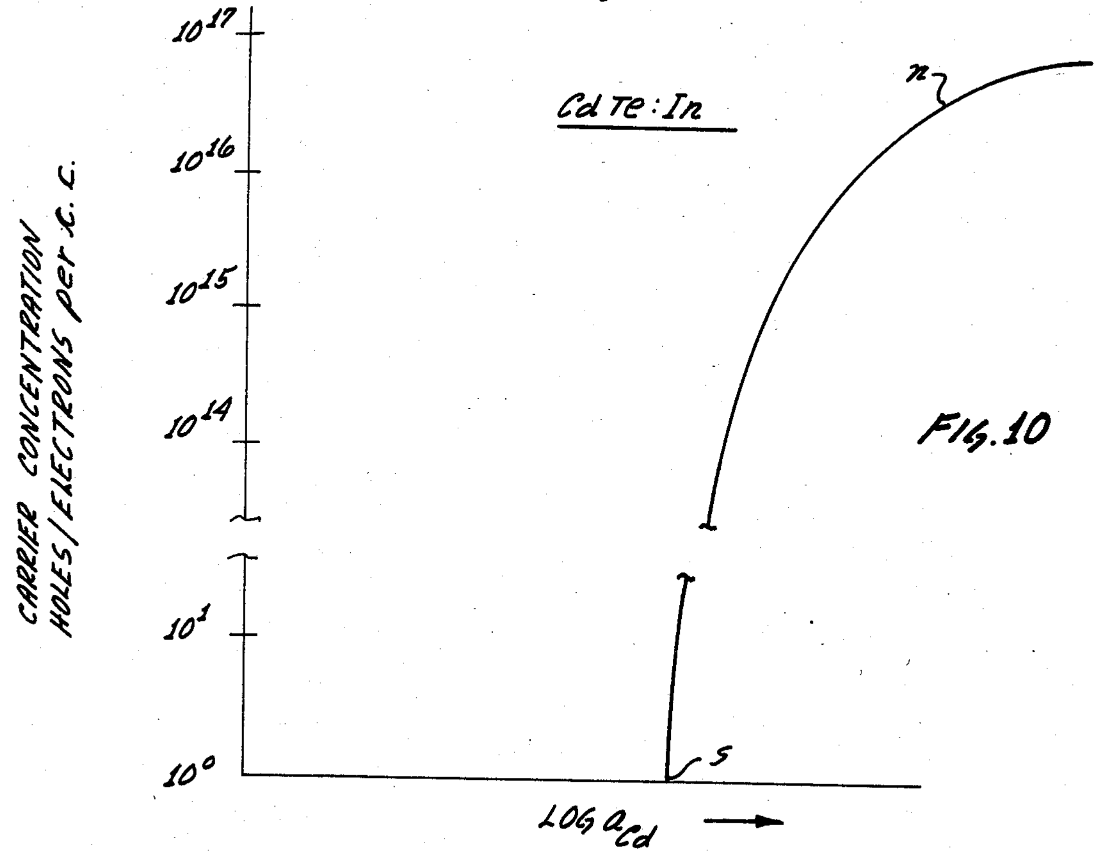
FIG. 10 is a graph showing how the carrier concentration in the cadmium telluride semiconductor compound doped with indium varies with cadmium activity therein.

Now, it is one thing to expect that if there are, say, $10^{15}$ hole carriers per c.c. in a compound and a given amount of indium is provided that introduces $10^{15}$ free electrons, then the effective concentration of free carriers in the material is zero. Thus, if the material, for example, is at point 40 on the curve (FIG. 6) and the indium is added which supplies enough electrons to neutralize the hole carriers, then it would be expected that the material should end up close to point 41 with a zero carrier concentration. But that is not what happens. When the indium is added to the material the whole p-region of the compound shown in FIG. 6 is opened up. So now it is possble to make compositions with the varying amounts of cadmium coming within the p-range to the left of the stoichiometric point S in FIG. 6, and still end up with a material having a resistivity on the order of $10^6$ to $10^7$ ohm-centimeter. In fact, once an amount of indium is added to the p-type material such that the hole carriers are no longer observed to exist by measurement tests, there no longer is a region with a p-curve and the graph of the compound is now that shown in FIG. 10.

It is believed that the reason for this phenomenon is that indium forms certain complexes which prevent the p-type CdTe compound from showing up once the proper amount of indium has been added. So the only problem to be concerned about is to make sure that too much indium has not been added inasmuch as that would move the CdTe compound out of the p-region and cause it to become conductive by electrons.

It has been shown from the above that the semiconductor compound CdTe can be doped by the use of a donor indium to provide a material having a resistivity of about $10^6$ to $10^7$ ohm-centimeter. However, as previously described in connection with FIG. 5, a matrix-addressed EL display panel requires a light sink layer material with a much higher resistivity because of the very high fields and localized regions of high current existing in the active layer thereof. Moreover, the creation of carriers due to thermal generation or band to band injection under high field conditions must be minimized.

Accordingly, next to be described is the manner in which this Te-rich semiconductor compound CdTe doped with indium can be further modified by the addition of lead (Pb). The Pb serves two purposes. It tailors the energy band gap of the compound so that it will absorb the full range of light waves in the visible spectrum, and it also further increases the resistivity of the compound by many orders as desired for a light sink layer 20 immediately behind the phosphor layer 18 in a matrix-addressed EL display panel.

First to be noted is that the semiconductor compound CdTe by itself, as shown in FIG. 7, has an energy band gap of 1.58 eV and consequently the compound does not effectively absorb the lower red light waves in the visible spectrum having an energy of 1.60 eV, So in order to obtain a smaller energy band gap, the Te-rich CdTe material doped with indium is mixed with Pb in the form of PbTe. In particular, as shown in FIG. 11, it has been discovered that a ternary compound comprising 20% PbTe and 80% CdTe doped with indium will provide a material with an energy band gap of 1.25 eV which is more than adequate for effectively absorbing the full range of light waves in the visible range from red to blue.

Now the Pb added to the semiconductor compound to form PbTe also serves to reduce the mobility of the free carriers in the compound so as to further increase the resistivity thereof.

Thus, it is well known that the number of free carriers in a material does not alone indicate the value of the specific resistivity thereof. Actually, the specific resistivity of a material is inversely proportional to the number of charge carriers and the mobility of the charge carriers therein. Therefore, when Pb is added to the compound, because of the large size of the Pb atoms and the large concentration thereof, which results in alloy scattering, the mobility of the free carriers generated in the semiconductor compound when a field is applied across the EL panel is reduced, thus increasing the resistivity of the compound such that it is now on the order of $10^8$ to $10^{12}$ ohm-centimeter.

It should now be understood that the reason for the 20% PbTe in the indium doped semiconductor compound is because it has been experimentally determined that such a proportion provides the right proportion of Pb in the compound to maximize the reduction of mobility of the free carriers therein, and thereby, increase its resistivity to within the desired range.

It should now be appreciated, that the ternary compound of the material for the light sink layer 20 of the EL panel, in accordance with the present invention, is actually made by combining 40% Cd, 10% Pb and 50% Te by weight and then adding an additional small amount, e.g., 0.05 gram of Te per 100 grams of the ternary compound. Then a small amount of indium, e.g., on the order of $10^{14}$ to $10^{17}$ atoms per c.c., is added to the compound. As a result, the hole carriers in the compound are compensated for by the free electrons donated by the indium to effectively increase the resistivity of the compound. Moreover, the presence of the Pb reduces the mobility of the free carriers in the compound to further increase its resistivity. Thus, the combined effects of the dopant indium and the Pb in the compound result in the resistivity thereof being increased to the order of $10^8$ to $10^{12}$ ohm-centimeter which is the level previously indicated as being desirable for the material being used as a light sink layer immediately behind the phosphor layer 18 of a matrix-addressed EL display panel.

As discussed previously in connection with FIG. 4, when the voltage across a pixel of the EL panel 10 is such that the polarity of the selected aluminum electrode is negative, the corresponding emission 44 of the phosphor layer 18 is quite small, as shown in FIG. 4*b*. In other words, the amount of light emitted by the phosphor layer of an EL panel provided with a light sink layer 20 immediately behind the rear surface thereof is only 60% to 70% of the light that is emitted by the phosphor layer of an EL panel without a light sink layer. Moreover, as is evident, approximately half of the light emitted by the phosphor layer is absorbed in the light sink layer. Thus, the above two factors cut down the light actually emitted, i.e., the luminance of the EL panel, by about 65% in the presence of the light sink layer. Now even in spite of this large loss of the light output from the EL panel due to the light sink layer being present, the contrast ratio of the lit and unlit pixels on the display EL panel is enhanced to such a level thereby that it more than offsets the loss of output luminance, Now contrast ratio, CR, is defined as follows:

$$CR = (\text{luminance} + \text{reflected ambience})/\text{reflected ambience}$$

Thus, assuming the EL panel 10 provided with the light sink layer 20 of the present invention is to be used in an environment wherein the ambient intensity is 10,000 foot candles (approximately 3138 fL) and, further, assuming the diffuse reflectance of the EL panel is 0.25% and the luminance of the lit pixels on the EL panel is 20 fL, the lit and unlit pixels on the EL panel will have a contrast ratio of about 3.5. This contrast ratio is more than sufficient to make the display legible.

The significance of the use of the light sink layer is made clear by pointing out that in the absence of the light sink layer on the EL panel, the EL panel would have to emit a luminance of 3900 fL instead of the 20 fL to obtain the same contrast ratio between the lit and unlit pixels of about 3.5.

While, in order to comply with the statute, the invention has been shown and described in language more or less specific as to structural features, it is to be understood that the invention is not limited to these specific features but that the composition and method of fabrication herein disclosed comprise a preferred form of putting the invention into effect and the invention is therefore claimed in any of its forms or modifications within the legitimate and valid scope of the appended claims.

What is claimed is:

1. A method of fabricating a light sink layer for deposition behind the phosphor layer of an EL panel comprising the steps of:

providing a Te-rich semiconductor compound of CdTe in combination with PbTe; and introducing indium as a dopant into said Te-rich semiconductor compound which is just sufficient to remove all evidence of p-type conduction therein;

whereby the resistivity of the compound is on the order of $10^8$ to $10^{12}$ ohm-centimeter.

2. A method of fabricating a light sink layer for a thin-film EL panel comprising the steps of:

providing a Te-rich semiconductor compound of CdTe in combination with PbTe; and introducing indium as a dopant into said Te-rich semiconductor compound which is just sufficient to remove all evidence of p-type conduction therein;

whereby the amount of cadmium in said CdTe can vary and still provide a semiconductor compound with a relatively high resistivity.

3. A method of fabricating a light sink layer for depositing behind the electroluminescent layer of a thin-film EL panel comprising the steps of:

forming a p-type semiconductor compound comprising 80% CdTe in combination with 20% PbTe; and adding to said semiconductor compound a sufficient amount of indium as a donor to neutralize the hole carriers therein;

wherein the semiconductor compound has an energy band gap small enough to absorb light in the visible range and has a specific resistivity on the order of $10^8$ to $10^{12}$ ohm-centimeter.

4. A method of fabricating a light sink layer for depositing behind the phosphor layer of a thin-film EL panel comprising the steps of:

mixing Cd, Te, Pb and a donor of indium to form a Te-rich semiconductor compound;

said Te-rich semiconductor compound having an energy band gap which is small enough to absorb light waves in the visible range; and said Te-rich semiconductor compound having free electrons introduced therein by said donor to compensate for the hole carriers therein and having the mobility of its free carriers generated when a field is applied across said EL panel reduced by the presence of said Pb therein;

whereby the resistivity of the Te-rich semiconductor compound is maximized.

5. A composition of matter consisting of:

a Te-rich semiconductor compound of Cd, Pb, and Te having hole carriers therein; and a dopant of indium added to said compound;

wherein said indium introduces electrons into the semiconductor compound to neutralize the hole charge carriers therein and thereby increase the specific resistivity of the compound to a level of about $10^6$ to $10^7$ ohm-centimeter; and wherein said Pb effectively reduces the mobility of the free charge carriers in the semiconductor compound to thereby further increase the specific resistivity of the compound to a level of about $10^8$ to $10^{12}$ ohm-centimeter.

6. A light sink layer for an electroluminescent thin-film display device comprising:

a non-stoichiometric semiconductor compound of CdTe in combination with PbTe;

a dopant for introducing charge carriers different than the charge carriers of said non-stoichiometric semiconductor compound for neutralizing the latter charge carriers to thereby increase the specific resistivity of said compound;

said PbTe in combination with said CdTe providing for tailoring the energy band gap of said semiconductor compound to absorb light in the visible range; and said Pb in said PbTe providing for reducing the mobility of the free charge carriers in said semiconductor compound to further increase the specific resistivity thereof.

7. An electroluminescent thin-film display device comprising:

an electroluminescent layer;

a light sink layer on the back of said electroluminescent layer;

a first dielectric layer on the front of said electroluminescent layer;

a second dielectric layer on the back of the said light sink layer;

a first set of transparent electrodes on the front of said first dielectric layer; and a second set of counter metallic electrodes on the back of said second dielectric layer;

said light sink layer formed of a p-type semiconductor compound comprised of CdTe in combination with PbTe and doped with indium and having an energy band gap for absorbing light in the visible range and a specific resistivity high enough to permit multiplexed drive of said device.

8. An electroluminescent thin-film display device comprising:

an electroluminescent layer;

a light sink layer on the back of said electroluminescent layer;

a first dielectric layer on the front of said electroluminescent layer;

a second dielectric layer on the back of said light sink layer;

a first set of transparent electrodes on the front of said first dielectric layer; and a second set of counter metallic electrodes on the back of said second dielectric layer;

said light sink layer formed of a p-type semiconductor compound comprised of PbTe in combination with CdTe and including a donor;

said donor providing electrons for compensating for the hole carriers of the p-type semiconductor compound to increase the resistivity thereof;

the Pb in said PbTe providing for reducing the mobility of the free carriers in said semiconductor compound to further increase the resistivity thereof whereby said semiconductor compound is provided with a specific resistivity on the order of $10^8$ to $10^{12}$ ohm-centimeter; and said semiconductor compound having an energy band gap for absorbing light in the visible range and having a specific resistivity high enough to permit multiplexed drive of said device.

* * * * *